US010852785B2

(12) United States Patent
Mundt et al.

(10) Patent No.: US 10,852,785 B2
(45) Date of Patent: Dec. 1, 2020

(54) DISK DRIVE CARRIERS AND MOUNTABLE HARD DRIVE SYSTEMS WITH IMPROVED AIR FLOW

(71) Applicants: Kevin W. Mundt, Austin, TX (US); Haesung B. Kwon, Austin, TX (US); Frank W. Yu, Austin, TX (US)

(72) Inventors: Kevin W. Mundt, Austin, TX (US); Haesung B. Kwon, Austin, TX (US); Frank W. Yu, Austin, TX (US)

(73) Assignee: Dell Products L.P., Round Rock, TX (US)

(*) Notice: Subject to any disclaimer, the term of this patent is extended or adjusted under 35 U.S.C. 154(b) by 252 days.

(21) Appl. No.: 15/076,154

(22) Filed: Mar. 21, 2016

(65) Prior Publication Data
US 2016/0202739 A1 Jul. 14, 2016

Related U.S. Application Data

(62) Division of application No. 14/023,939, filed on Sep. 11, 2013, now Pat. No. 9,317,081.

(51) Int. Cl.
H05K 7/00 (2006.01)
G06F 1/20 (2006.01)
(Continued)

(52) U.S. Cl.
CPC ............ G06F 1/20 (2013.01); G06F 1/187 (2013.01); G11B 33/02 (2013.01); G11B 33/128 (2013.01);
(Continued)

(58) Field of Classification Search
None
See application file for complete search history.

(56) References Cited

U.S. PATENT DOCUMENTS 5,463,527 A 10/1995 Hager et al.
6,147,834 A 11/2000 Srikrishna et al.
(Continued)

OTHER PUBLICATIONS

Mundt et al., "Hard Disk Drive Assemblies With Open Side Wall Areas", U.S. Appl. No. 14/821,956, filed Aug. 10, 2015, Office Action filed Jun. 2, 2017, 14 pgs.
(Continued)

Primary Examiner — Courtney L Smith
Assistant Examiner — Rashen E Morrison
(74) Attorney, Agent, or Firm — Egan Peterman Enders Huston

(57) ABSTRACT

The side profile of a hard drive assembly may be configured with one or more open areas to allow cooling air to pass side-to-side through a lateral flow channel provided by a cavity defined in the base portion of the hard drive assembly. Corresponding and complementary open areas may be also be defined in mating drive carrier assembly side components to allow passage of lateral side-to-side cooling air through the base portion flow channel of a hard drive assembled to the drive carrier assembly to form a mountable hard drive system that is installed into a storage enclosure. The at least partially aligned open flow areas of the assembled hard dive assembly and drive carrier assembly may cooperate to reduce air flow impedance across multiple rows of hard drive systems through a storage enclosure.

25 Claims, 10 Drawing Sheets

(51) Int. Cl.
*G06F 1/18* (2006.01)
*G11B 33/14* (2006.01)
*G11B 33/02* (2006.01)
*H05K 7/20* (2006.01)
*G11B 33/12* (2006.01)

(52) U.S. Cl.
CPC ....... *G11B 33/142* (2013.01); *H05K 7/20727* (2013.01)

(56) References Cited

U.S. PATENT DOCUMENTS

| | | | | |
|---|---|---|---|---|
| 6,236,570 | B1* | 5/2001 | Gotzfried | G11B 33/128 |
| | | | | 361/725 |
| 6,445,586 | B1* | 9/2002 | Chou | G06F 1/182 |
| | | | | 312/223.1 |
| 6,473,297 | B1* | 10/2002 | Behl | G06F 1/184 |
| | | | | 361/679.33 |
| 6,480,380 | B1 | 11/2002 | French et al. | |
| 6,549,397 | B1 | 4/2003 | Diaz et al. | |
| 6,628,518 | B2* | 9/2003 | Behl | G11B 33/022 |
| | | | | 312/223.1 |
| 7,027,299 | B2* | 4/2006 | Wrycraft | G06F 1/20 |
| | | | | 165/185 |
| 7,315,456 | B2* | 1/2008 | Mondor | G06F 13/409 |
| | | | | 361/788 |
| 8,094,451 | B2* | 1/2012 | Bellin | G06F 1/20 |
| | | | | 361/695 |
| 8,164,849 | B1 | 4/2012 | Szeremeta et al. | |
| 9,141,153 | B2 | 9/2015 | Mundt et al. | |
| 9,317,081 | B2 | 4/2016 | Mundt et al. | |
| 9,612,632 | B2* | 4/2017 | Sinha | G06F 1/182 |
| 2001/0048590 | A1* | 12/2001 | Behl | G11B 33/022 |
| | | | | 361/679.47 |
| 2003/0051185 | A1* | 3/2003 | Garnett | G06F 1/183 |
| | | | | 714/1 |
| 2003/0147211 | A1* | 8/2003 | Fairchild | G11B 33/142 |
| | | | | 361/679.31 |
| 2005/0036232 | A1* | 2/2005 | Macpherson | G11B 25/043 |
| | | | | 360/97.18 |
| 2006/0181845 | A1* | 8/2006 | Shah | G11B 33/12 |
| | | | | 361/679.4 |
| 2008/0174907 | A1 | 7/2008 | Johnston et al. | |
| 2008/0174948 | A1* | 7/2008 | Davis | G11B 33/127 |
| | | | | 361/679.31 |
| 2012/0087038 | A1* | 4/2012 | Kwon | G11B 19/042 |
| | | | | 360/86 |
| 2012/0110262 | A1 | 5/2012 | Zhang et al. | |
| 2012/0275057 | A1 | 11/2012 | McGuire, Jr. | |
| 2013/0264919 | A1* | 10/2013 | Sullivan | H05K 5/0204 |
| | | | | 312/223.2 |
| 2013/0265711 | A1 | 10/2013 | Chen | |
| 2013/0308266 | A1* | 11/2013 | Sullivan | G06F 1/20 |
| | | | | 361/679.46 |
| 2013/0342990 | A1 | 12/2013 | Jau et al. | |
| 2014/0204525 | A1* | 7/2014 | Pecone | H05K 13/00 |
| | | | | 361/679.33 |
| 2015/0070828 | A1* | 3/2015 | Mundt | G06F 1/187 |
| | | | | 361/679.33 |
| 2015/0072606 | A1 | 3/2015 | Mundt et al. | |
| 2015/0348593 | A1 | 12/2015 | Mundt et al. | |
| 2016/0202739 | A1 | 7/2016 | Mundt et al. | |

OTHER PUBLICATIONS

Mundt et al., "Hard Disk Drive Assemblies With Open Side Wall Areas", U.S. Appl. No. 14/821,956, filed Aug. 10, 2015, Response to Office Action filed Mar. 16, 2017, 3 pgs.
Mundt et al., "Disk Drive Carriers and Mountable Hard Drive Systems With Improved Air Flow", U.S. Appl. No. 14/023,939, filed Sep. 11, 2013, Restriction Office Action, 6 pgs.
Mundt et al., "Disk Drive Carriers and Mountable Hard Drive Systems With Improved Air Flow", U.S. Appl. No. 14/023,939, filed Sep. 11, 2013, Amendment, 11 pgs.
Mundt et al., "Disk Drive Carriers and Mountable Hard Drive Systems With Improved Air Flow", U.S. Appl. No. 14/023,939, filed Sep. 11, 2013, Office Action, Apr. 22, 2015, 15pgs.
Mundt et al., "Disk Drive Carriers and Mountable Hard Drive Systems With Improved Air Flow", U.S. Appl. No. 14/023,939, filed Sep. 11, 2013, Response to Office Action, dated Jul. 22, 2015, 16 pgs.
Mundt et al., "Disk Drive Carriers and Mountable Hard Drive Systems With Improved Air Flow", U.S. Appl. No. 14/023,939, filed Sep. 11, 2013, Final Office Action, dated Aug. 24, 2015, 16 pgs.
Mundt et al., "Disk Drive Carriers and Mountable Hard Drive Systems With Improved Air Flow", U.S. Appl. No. 14/023,939, filed Sep. 11, 2013, Response to Final Office Action, dated Oct. 26, 2015, 15 pgs.
Mundt et al., "Hard Disk Drive Assemblies With Open Side Wall Areas", U.S. Appl. No. 14/821,956, filed Aug. 10, 2015, Preliminary Amendment filed Aug. 19, 2015, 7 pgs.
Mundt et al., "Hard Disk Drive Assemblies With Open Side Wall Areas", U.S. Appl. No. 14/821,956, filed Aug. 10, 2015, Office Action dated Nov. 16, 2016, 12 pgs.
Mundt et al., "Hard Disk Drive Assemblies With Open Side Wall Areas", U.S. Appl. No. 14/821,956, filed Aug. 10, 2015, Response to Office Action dated Sep. 5, 2017, 13 pgs.
Mundt et al., "Hard Disk Drive Assemblies With Open Side Wall Areas", U.S. Appl. No. 14/821,956, filed Aug. 10, 2015, Final Office Action dated Dec. 13, 2017, 18 pgs.
Xyratex, Storage, "One Stor SP-2584", Mar. 2012, 2 pgs.
Raid Inc., "Data Storage Products and Custom Solutions", Printed From Internet May 30, 2013, 5 pgs.
SGI, "SGI InfiniteStorage 6120", Printed From Internet May 30, 2013, 1 pg.
Warp Mechancis Products, WDS-8460, Printed From Internet May 30, 2013, 1 pg.
The Register, "NetApp Adds Lustre to Big Data Line-Up" Printed From Internet May 30, 2013, 3 pgs.
Starline Computer, "Up to 48x LFF Drives With Nestor JBOD", Printed From Internet May 30, 2013, 2 pgs.
Xyratex, Storage, Products, "OneStor SP-2584", Printed From Internet Sep. 10, 2013, 3 pgs.
DataDirect, "DDN/S2A6620—The High Density, Integrated Mid-Range Storage Appliance", Printed From Internet May 30, 2013, 2 pgs.
Mundt et al., "Hard Disk Drive Assemblies With Open Side Wall Areas", U.S. Appl. No. 14/821,956, filed Aug. 10, 2015, Response to Final Office Action filed Mar. 13, 2018, 13 pgs.

* cited by examiner

US 10,852,785 B2

DISK DRIVE CARRIERS AND MOUNTABLE HARD DRIVE SYSTEMS WITH IMPROVED AIR FLOW

RELATED APPLICATIONS

This application is a divisional of pending U.S. patent application Ser. No. 14/023,939, filed on Sep. 11, 2013 and entitled "Disk Drive Carriers And Mountable Hard Drive Systems With Improved Air Flow", the entire disclosure of which is incorporated herein by reference.

The present application is related in subject matter to patent application Ser. No. 14/023,991 filed Sep. 11, 2013, entitled "HARD DISK DRIVE ASSEMBLIES WITH OPEN SIDE WALL AREAS" by Mundt et al., which is incorporated herein by reference in its entirety.

FIELD OF THE INVENTION

This invention relates generally to information handling systems and, more particularly, to disk drive carriers and mountable hard drive systems for information handling systems.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems include enterprise storage systems. To increase rack level drive density for enterprise storage systems, the quantity of hard drives contained within drive enclosures for enterprise storage systems has increased over time. In the past, racked storage enclosure form factors often had a single row of hard drives that were inserted from the front of the system, and storage controllers and power supplies were then inserted from the rear of the system. These existing front load systems hold the single row of drives in a position such that fresh air drawn in from a rear-positioned fan flows from front-to-back across the length of each drive in the single row.

FIG. 1 illustrates a bottom perspective view of a conventional hard drive (3.5 inch HDD) assembly 100 having a cavity 110 that is defined in the bottom surface 102 of the base portion 160 of the casting of the hard drive assembly 100. As shown, drive assembly 100 has a front end 132, a back end 134, and two opposing side walls 136 and 138. Threaded mounting holes 105 are defined in the opposing side walls 136 and 138 of drive assembly 100 to receive complementary threaded fasteners that serve the purpose of securing a drive carrier assembly to the hard drive assembly 100 as further described herein. In FIG. 1, the top portion 150 of the drive assembly 100 is a sealed space that contains the drive media and read/write arm (heads). The base portion 160 of the drive assembly 100 (delineated from top section 150 by dashed lines) generally consists of a drive controller printed circuit board (PCB) assembly 152, a motor housing 153, and has protrusions/ribs 154 for bearings and stiffening features. The base portion 160 is configured to perform multiple roles for the drive assembly 100, including providing shock/rotational vibration (RV)/dynamics dampening, thermal dissipation, front-to-back (longitudinal) air flow, and head/disk interface (HDI) stability.

As shown in FIG. 1, ribs 154 are not sized to be the full height of the drive's casting (i.e., they do not extend to the match the full height of the side walls 136 and 138 of base portion 160). In this regard, the height of ribs 154 is reduced relative to the side walls 136 and 138 to optimize for longitudinal (front-to-back) air flow when drive assembly 100 is deployed in a conventional front load single row drive enclosure system. The side walls 136, 138 of the drive assembly 100 are full height so that the bottom surface of the side walls 136, 138 provides a primary measuring datum for the drive assembly 100. Additionally, many enclosure designers utilize the bottom surface of a drive assembly 100 as a constraint for drive mounting or for drive rails.

FIG. 2 shows the hard drive assembly 100 of FIG. 1 as it may be mechanically coupled to two side components (rails) 202 and 204 of a drive carrier assembly 200 by threaded mounting screws 106 received through mounting holes 107 of drive carrier assembly 200 into threaded mounting holes 105 of drive assembly 100 to form a conventional mountable hard drive system 250. As shown, side mounting rails 202 and 204 of drive carrier assembly 200 are configured to slide along a contiguous rail surface of side walls 138 and 136 of hard drive assembly 100 between the fastener holes 105. As further shown in FIG. 2, drive carrier side components 202 and 204 are configured to support a cross member in the form of a drive handle mechanism 220 there between that allows for insertion and removal of front end 132 of drive assembly 100 from mating relationship with a corresponding mechanism within the drive enclosure that is configured to mount and secure the drive assembly 100 in operable engagement within the drive enclosure. When deployed within a conventional front-loading single row drive enclosure, some cooling airflow advantage is realized due to airflow tunneling from front-to-back through the cavity 110 defined in the bottom surface 102 of the base portion 160 drive assembly 100 as shown by the arrows 290 in FIG. 2.

To gain more drive density, a new class of racked storage dense enclosure has emerged having a form factor that utilizes a drive drawer that is filled with rows of hard drives. FIG. 3 illustrates a cut-away perspective view of one example of drawer and drive components of a conventional drawer-based dense storage drive enclosure 300. As shown enclosure 300 includes a drawer 320 having multiple and parallel rows 310 of closely-spaced hard drive assemblies 100 and their respective corresponding drive carrier assemblies 200 that are oriented side-to-side across the drawer of the enclosure 300, with rear-mounted cooling fans 390 that draw fresh cooling air 350 into the enclosure 300 from the front of the enclosure 300 and expel the warmed cooling air 352 from the back of the enclosure 300. For illustration purposes, chassis enclosure walls that surround drawer 320 and rows 310 of hard drive systems 250 are not shown in FIG. 3. Most of such conventional drawer-based implementations are designed for vertical top loaded insertion of the mountable hard drive systems 250 into the drawer 320, i.e., the hard drive systems 250 are loaded vertically from the top into the drawer 320 of the storage enclosure 300 in a toaster-style fashion with the front 132 of the drive assemblies 100 facing upwards and with one side wall 136 or 138 facing toward the front of the enclosure.

As further shown in FIG. 3, this vertical drive-loading configuration creates airflow and cooling problems for the multiple rows 310a to 310f of hard drive assemblies 100. When a hard drive system 250 is inserted in a vertical fashion in a dense system enclosure, the solid side wall profiles 136 and 138 of the drive assembly 100 and solid side profiles of side components (rails) 202 and 204 of carrier assembly 200 completely block the lateral (side-to-side) flow of cooling air through the drive assemblies as shown by arrows 292 in FIG. 2. The only pathways for air flow through each row of drive assemblies of the dense enclosure drawer is through any provided gaps 398 existing between different adjacent drive assemblies 100 of each row 310 and through any provided gaps 399 present between the enclosure walls and the ends of the rows 310 as shown in FIG. 3.

Due to the multiple side-to-side orientation of the rows of hard drive systems 250, only the front-most row 310a of hard drive assemblies 100 receives fresh cooling air 350 from the front-positioned cooling fans, while each successive row 310b to 310f of drive assemblies 100 toward the rear of the enclosure receives pre-heated air that has already flowed across the previous row/s of hard drive assemblies 100 in the enclosure. At the same time, the close spacing of the hard drive systems 250 within each row acts to restrict the flow of air across the row 310 due to the solid mass of the full-height side walls 136, 138 of the individual drive assemblies 100 that are closely spaced together within each row. This results in an overall reduction in rate of cooling air flow across the drive assemblies 100 of the enclosure. Increasing the gap size between adjacent hard drive systems 250 in the same row 310 more allows for more air flow, but reduces the number of hard drive systems 250 that can be installed in the dense enclosure system. Thus, airflow requirements conflict with drive density desires in conventional dense enclosure systems.

SUMMARY OF THE INVENTION

Disclosed herein are systems and methods that may be implemented to provide open areas in the opposing side walls of a hard disk drive assembly to optimize lateral (side-to-side) cooling air flow across a hard disk drive assembly in a storage enclosure or other type of hard drive enclosure (e.g., such as server chassis) by providing a flow channel defined within the base portion of the disk drive assembly to decrease impedance of lateral air flow across the disk drive assembly and through the hard drive enclosure.

In one exemplary embodiment, the side profile of a hard drive assembly may be configured with one or more open areas (e.g., with a series of holes or a series of notches defined in the side walls or rails of the drive assembly base portion) to allow air to pass side-to-side through a lateral flow channel provided by a cavity defined in the base portion of the drive assembly. In this way, the air may pass through the lateral flow channel and towards and contacting areas of the bottom surface of the drive assembly located between the sides of the hard drive assembly. Corresponding and complementary open areas in the form of air flow inlet/s and outlet/s may be also be defined in mating drive carrier assembly side components to allow passage of lateral side-to-side cooling air through the base portion flow channel of a mated drive assembly when the mated hard drive assembly and drive carrier assembly are installed together as a mountable hard drive system into a hard drive enclosure. In one embodiment, the provided lateral flow channel may be further implemented in a manner that results in substantially no loss to other functionalities of the drive assembly base portion, such as dynamic dampening, thermal dissipation, and HDI. The disclosed systems and methods may also be implemented in one embodiment in a manner that reduces air flow impedance across hard drive systems and through a storage enclosure (as compared to the air flow impedance across conventional hard drive systems similarly oriented and contained in a storage enclosure) in order to achieve both reduced cooling fan power costs and increased cooling efficiency for an individual drive assembly as well as to achieve increased cooling efficiency on a system level for multiple drive assemblies deployed in a dense storage enclosure.

In one exemplary embodiment, open area/s in the form of one or more openings (e.g., holes, notches, recesses, cut-outs, etc.) may be defined in the side walls or rails of the drive assembly base portion that are configured for at least partially overlapping or aligning with an open area (e.g., one or more corresponding openings, notches, recesses, cut-out areas, etc.) provided by mating drive carrier side components of a drive carrier assembly when the drive carrier assembly is assembled to the drive assembly as a mountable hard drive system in order to enable additional flow of air, for example, to provide additional air flow space to supplement the minimal air flow space in the gap between mounted hard drive systems of a hard drive enclosure. For example, in one exemplary embodiment, openings or notches may be defined in the drive assembly that mimic (i.e., copy or match) the pattern of openings and/or notches defined in the drive assembly casting. In another exemplary embodiment, open area may be defined in the side walls of a drive assembly that are configured to align with a drive carrier assembly above the depth of a provided notch in a drive carrier side components or a lowered drive carrier side wall of a mated drive carrier assembly when the two components are assembled together as a mountable hard drive system.

In one respect, disclosed herein is a mountable hard drive system, including a hard drive assembly and a drive carrier assembly. The hard drive assembly may include: a front end, a back end, and two opposing side walls extending between the front end and back end of the hard drive assembly, a bottom surface having a drive cavity defined therein between the two opposing side walls, and at least one open area defined in each of the opposing side walls, the open area of each side wall being in fluid communication with the drive cavity. The drive carrier assembly may include two opposing side rail components, each of the side rail components having at least one air flow area defined therein. Each given one of the two side rail components of the drive carrier assembly may be mechanically coupled to a different one of the two opposing side walls of the hard drive assembly such that the open flow area of the given side rail component is at least partially aligned with the open flow area of the given one of the opposing side walls of the hard drive assembly to form an air flow channel across the drive cavity of the hard drive assembly between the two opposing side walls and the two opposing side rail components.

In another respect, disclosed herein is a hard drive enclosure system, including at least one hard drive system mounted within the hard drive enclosure, the mountable hard drive system including a hard drive assembly and a drive carrier assembly mechanically coupled to the hard drive system. The hard drive assembly may include: a front end, a back end, and two opposing side walls extending between the front end and back end of the hard drive assembly, a bottom surface having a drive cavity defined therein between the two opposing side walls, a top surface opposite the bottom surface, and at least one open area defined in each of the opposing side walls, the open area of each side wall being in fluid communication with the drive cavity. The drive carrier assembly may include two opposing side rail components, each given one of the side rail components having at least one air flow area defined therein and being mechanically coupled to a different one of the two opposing side walls of the hard drive assembly such that the open flow area of the given side rail component is at least partially aligned with the open flow area of the given one of the opposing side walls of the hard drive assembly to form an air flow channel across the drive cavity of the hard drive assembly between the two opposing side walls and the two opposing side rail components. The hard drive enclosure system may further include: multiple enclosure walls surrounding the hard drive system, and a cooling air flow source configured to induce lateral side-to-side flow of cooling air through the flow channel of the hard drive system across the drive cavity of the hard drive assembly between the two opposing side walls and the two opposing side rail components.

In another respect, disclosed herein is a method of cooling at least one mountable hard drive system that includes a hard drive assembly mechanically coupled to a drive carrier assembly, the method including providing cooling air to the mountable hard drive system. The hard drive assembly may include: a front end, a back end, and two opposing side walls extending between the front end and back end of the hard drive assembly, a bottom surface having a drive cavity defined therein between the two opposing side walls, and at least one open area defined in each of the opposing side walls, the open area of each side wall being in fluid communication with the drive cavity. The drive carrier assembly may include two opposing side rail components, each of the side rail components having at least one air flow area defined therein, and where each given one of the two side rail components of the drive carrier assembly is mechanically coupled to a different one of the two opposing side walls of the hard drive assembly such that the open flow area of the given side rail component is at least partially aligned with the open flow area of the given one of the opposing side walls of the hard drive assembly to form an air flow channel across the drive cavity of the hard drive assembly between the two opposing side walls and the two opposing side rail components. The method may further include using a cooling air flow source to induce lateral side-to-side flow of cooling air through the flow channel of the hard drive system across the drive cavity of the hard drive assembly between the two opposing side walls and the two opposing side rail components.

In another respect, disclosed herein is a drive carrier assembly configured for mechanically coupling to a hard drive assembly to form a mountable hard drive system, the drive carrier system including two opposing side rail components, each of the side rail components having at least one air flow area defined therein. Each given one of the two side rail components of the drive carrier assembly may be configured to be mechanically coupled to a different one of two opposing side walls of a hard drive assembly that itself has: a front end, a back end, and two opposing side walls extending between the front end and back end of the hard drive assembly, a bottom surface having a drive cavity defined therein between the two opposing side walls, and at least one open area defined in each of the opposing side walls, the open area of each side wall being in fluid communication with the drive cavity. Each given one of the two side rail components of the drive carrier assembly may be configured to be mechanically coupled to a different one of the two opposing side walls of the hard drive assembly such that the open flow area of the given side rail component is at least partially aligned with the open flow area of the given one of the opposing side walls of the hard drive assembly to form an air flow channel across the drive cavity of the hard drive assembly between the two opposing side walls and the two opposing side rail components.

DESCRIPTION OF ILLUSTRATIVE EMBODIMENTS

Figure 4:
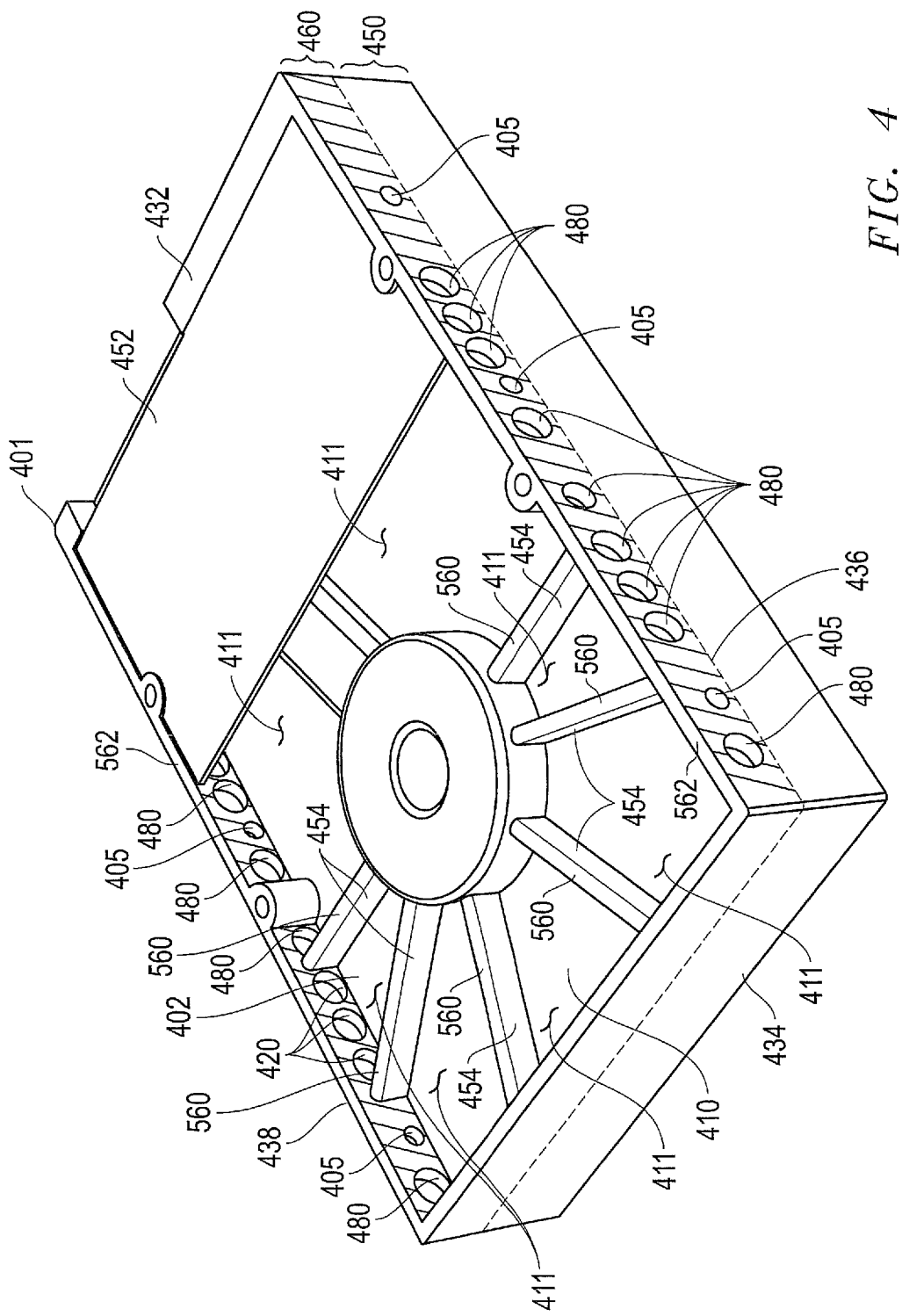
FIG. 4 illustrates a bottom perspective view of a hard drive assembly according to one exemplary embodiment of the disclosed systems and methods.

FIG. 4 illustrates one exemplary embodiment of a hard drive assembly 400 that is a hard drive 401 (e.g., such as a 3.5 inch HDD) having a cavity 410 that is defined in the bottom surface 402 of the base portion 460 of the casting (e.g., metal casting) of the hard drive assembly 400. Not shown is the opposing top surface of hard drive assembly 400 that may in one embodiment be a substantially flat and solid surface, e.g., with no cavity defined therein. As shown, drive assembly 400 has a front end 432, a back end 434, and two opposing side walls 436 and 438. Threaded mounting (fastener) holes 405 are defined in the opposing side walls 436 and 438 of drive assembly 400 to receive complementary mating threaded fasteners 506 for secureably mounting a drive carrier assembly to hard drive assembly 400 as described further herein. In the exemplary embodiment of FIG. 4, a solid planar wall portion 411 of bottom surface 402 delineates and separates a hermetically sealed top section 450 from the cavity 410 of base portion 460 of the hard drive assembly.

In FIG. 4, the top portion 450 of the drive assembly 400 is a hermetically sealed space that contains the drive media and read/write arm (heads). The base portion 460 of the drive assembly 400 (delineated from top section 450 by dashed lines) generally includes a drive controller PCB assembly 452 including drive controller circuitry adjacent the front end 432, a drive motor housing 453, and has protrusions/ribs 454 extending from wall portion 411 of bottom surface 402 and radiating from drive motor housing 453 for bearings and stiffening features. In one embodiment, hard drive assembly 400 may have a lateral (minor axis) dimension of about 3.5 inches wide measured between side walls 436 and 438, and a longitudinal (major axis) dimension of about 6 inches long measured between front end 432 and back end 434, although it is possible that a hard drive assembly 400 may have a form factor of any other size or shape (e.g., larger or smaller).

As shown in embodiment of FIG. 4, side walls 436 and 438 of base portion 460 of hard drive assembly 400 may be configured with open areas to allow cooling air to pass laterally from side-to-side between side walls 436 and 438 through a flow channel defined in the base portion 460 of the hard drive assembly 400. For example, in the exemplary embodiment of FIG. 4, open areas in the form of multiple circular air flow openings 480 (e.g., multiple holes drilled through side walls 436 and 438 that are separate and different from the mounting holes 405) are defined in each of side walls 436 and 438 in fluid communication with cavity 410 so as to allow flow of cooling air into and out of cavity 410 of the base portion 460 of hard drive assembly 400. In this embodiment, the openings 480 are defined in the drive side wall casting relatively low on the drive assembly (i.e., in the base portion 460) and are defined in positions that are partially in line with threaded mounting holes 405 as shown, although any other suitable alternative forms of mounting technology may be employed to secure a drive carrier assembly 200 to a hard drive assembly 100. Openings 480 are also illustrated as being longitudinally-aligned with each other along the side rails 436 and 438, although such alignment is not required in al embodiments.

It will be understood that the number and size of open areas (such as air flow openings 480) may vary and in one embodiment may be selected to provide a total open area (e.g., total open air flow area) in the side of a hard drive assembly side wall to achieve a desired air flow capacity through a hard drive assembly cavity during operation. For example, in one exemplary embodiment, the number and size of air flow openings 480 defined to extend through each of side walls 436 and 438 of base portion 460 may be selected to provide a total combined open area through the given side wall that represents at least about 20% of the total dimensional side area of each of side walls 436 and 438 of base portion 460, alternatively at least about 30% of the total dimensional side area of each of side walls 436 and 438 of base portion 460, alternatively from about 20% to about 60% of the total dimensional side area of each of side walls 436 and 438 of base portion 460, alternatively from about 30% to about 60% of the total dimensional side area of each of side walls 436 and 438 of base portion 460, alternatively from about 20% to about 50% of the total dimensional side area of each of side walls 436 and 438 of base portion 460, and further alternatively from about 30% to about 50% of the total dimensional side area of each of side walls 436 and 438 of base portion 460. However, it is also possible that total combined open area through the given side wall that may represents less than about 20%, or greater than about 60% of the total dimensional side area of each of side walls 436 and 438 of base portion 460. In one embodiment, the range or particular value of combined open area as a percentage of the total dimensional side area of each of side walls 436 and 438 of base portion 460 may be selected so as not to impact other drive performance characteristics, such as dynamic performance and thermal performance.

It will be understood that the above-noted total dimensional side area of each of side walls 436 and 438 of base portion 460 refers to the surface area defined along the length of each of the side walls 436 and 438 of base portion 460 (as illustrated by cross-hatching of the total dimensional side area of side wall 436 of base portion 460 in FIG. 4) which is defined between the respective bottom surfaces 560 and 562 of the side walls 436 and 438 and the projected line of intersection of wall portion 411 with each of side walls 436 and 438.

Still referring to FIG. 4, ribs 454 are sized so as not to extend from wall portion 411 to the full height of the drive's casting (i.e., they do not extend to the match the full height of the side walls 436 and 438 of base portion 460), for example leaving a space of about 0.8 inches in one exemplary embodiment between the bottom surface 560 of the rails and the bottom surface 562 of the side walls 436 and 438 of base portion 460, although any other relative height of ribs 454 relative to height of side walls 436 and 438 may be employed to achieve a lateral (side-to-side) flow channel through base portion 460. This created flow channel allows for side-to-side cooling air flow through openings 480 and across cavity 410 when drive assembly 400 is deployed in a dense storage enclosure or any other hard drive enclosure configuration having side impinging cooling air flow. As shown, the perforated side walls 436, 438 of the drive assembly 400 are full height so that the bottom surface of the sidewalls 436, 438 provide a primary measuring datum for the drive assembly 400 while at the same time also providing inlet openings 480 and outlet openings 480 to allow a lateral side-to-side cooling air flow through the channel in base portion 460 of drive assembly 400.

Figure 5A:
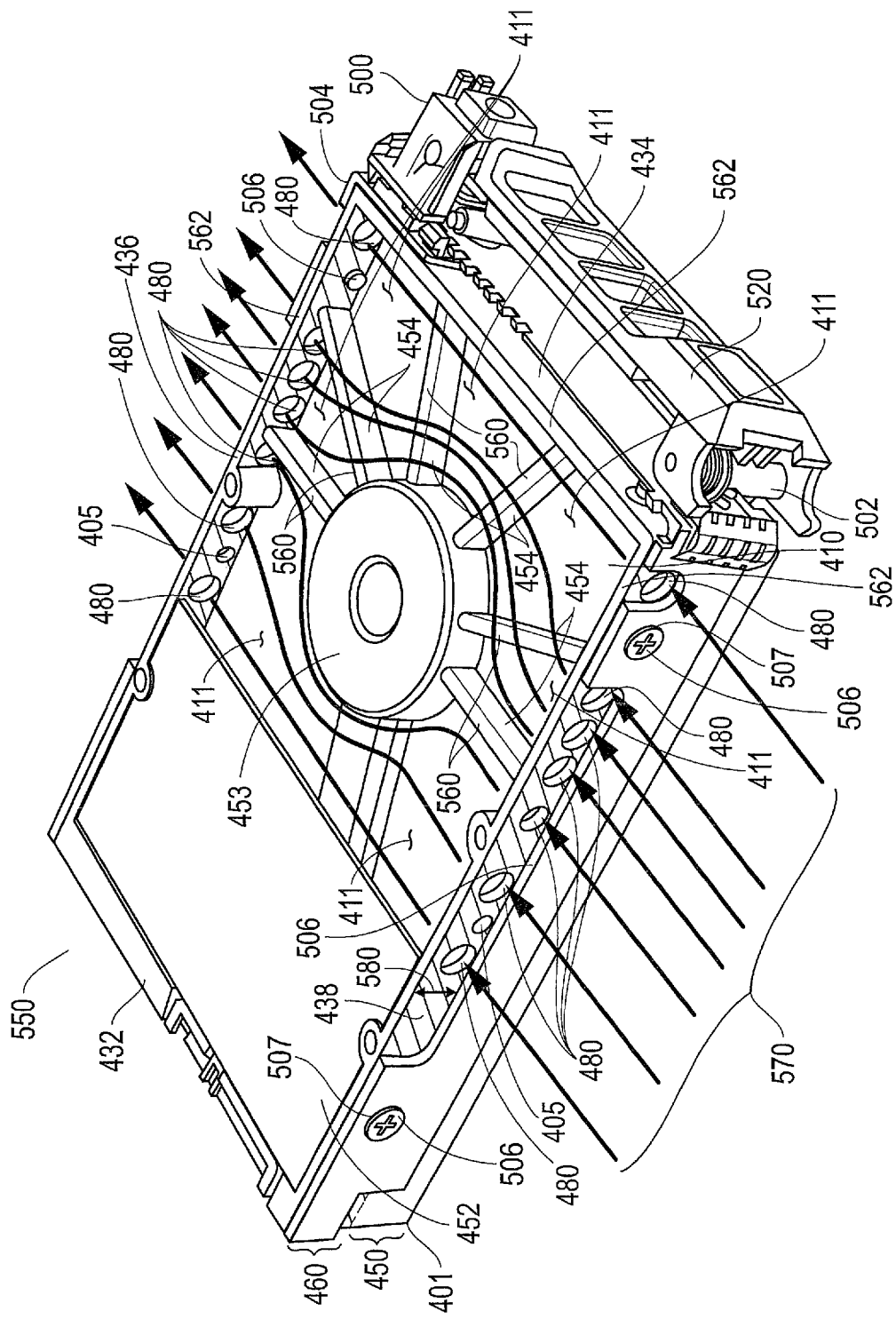
FIG. 5A illustrates a bottom perspective view of a mountable hard drive system according to one exemplary embodiment of the disclosed systems and methods.
Figure 5B:
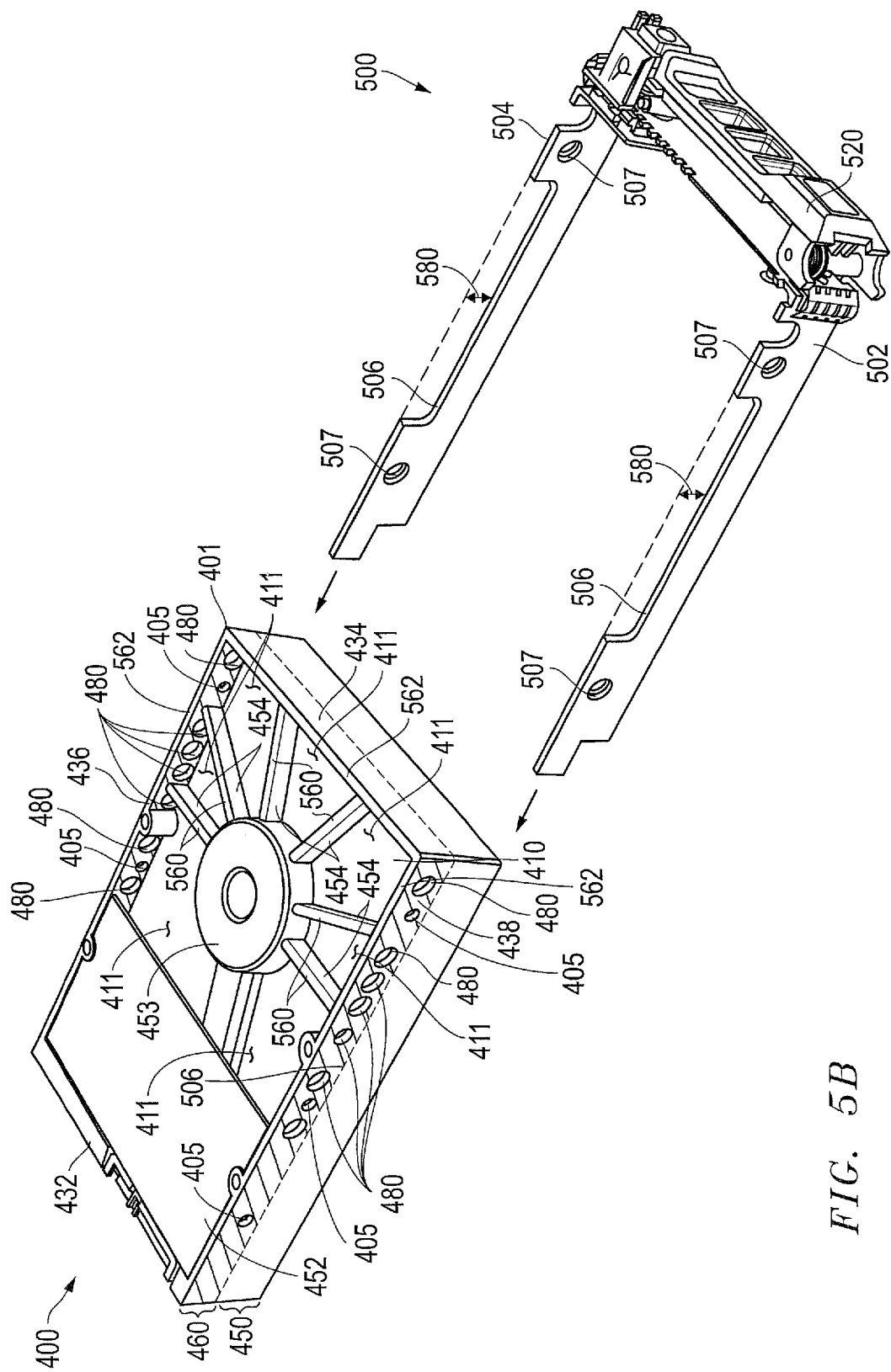
FIG. 5B illustrates a bottom exploded perspective view of components of a mountable hard drive system according to one exemplary embodiment of the disclosed systems and methods.

FIG. 5A shows the hard drive 401 of hard drive assembly 400 of FIG. 4 as it may be mechanically coupled to two side rail components 502 and 504 of a drive carrier assembly 500 by threaded mounting screws 506 received through mounting holes 507 of drive carrier assembly 200 into threaded mounting holes 405 of drive assembly 400 to form a mountable hard drive system 550. FIG. 5B is an exploded view showing the hard drive 401 of hard drive assembly 400 and drive carrier assembly 500 in position for assembly together. As further shown in FIGS. 5A and 5B, drive carrier side components 502 and 504 of this exemplary embodiment are configured to support a cross member in the form of a drive handle and bezel mechanism 520 there between that allows for insertion of front end 432 of drive assembly 400 into a drive enclosure and for subsequent removal therefrom, e.g., in a hot-pluggable manner. In this regard front end 432 of drive assembly 400 may be inserted into mating relationship with a corresponding electrical and mechanical interconnect mechanism within a drive enclosure that is configured to mechanically secure the drive assembly 400 in operable electrical engagement within the drive enclosure. Drive carrier components 502, 504 and 520 may be constructed of any suitably strong material (e.g., metal, plastic, etc.).

In the illustrated embodiment of FIGS. 5A and 5B, each of drive carrier side components 502 and 504 may be configured with a reduced cross section 506 to define a recessed open area 580 in drive carrier side components that are positioned adjacent and that at least partially overlap the multiple air flow openings 480 defined in each of side walls 436 and 438 of base portion 460 to allow access for flow of cooling air 570 into and out of openings 480 of respective sidewalls 438 and 436 when attached to respective side components 502 and 504 of drive carrier assembly 500 as shown. Drive carrier side component 504 is not fully visible in FIG. 5A, but as shown in FIG. 5B it may be similarly configured as side component 502, e.g., with a recessed open area 570 disposed adjacent the multiple air flow openings 480 defined in side wall 436 of base portion 460 to allow access for flow of cooling air 570 into or out of openings 480 of sidewall 436. Thus, when multiple adjacent rows of hard drive systems 550 are inserted or otherwise mounted into a drawer-based dense storage drive enclosure 600 such as illustrated in FIG. 6, lateral side-to-side flow of cooling air 570 through the base portion 460 of each drive assembly 400 of each of adjacent rows 310 may be achieved as further shown and described herein in relation to FIG. 6.

Figure 6A:
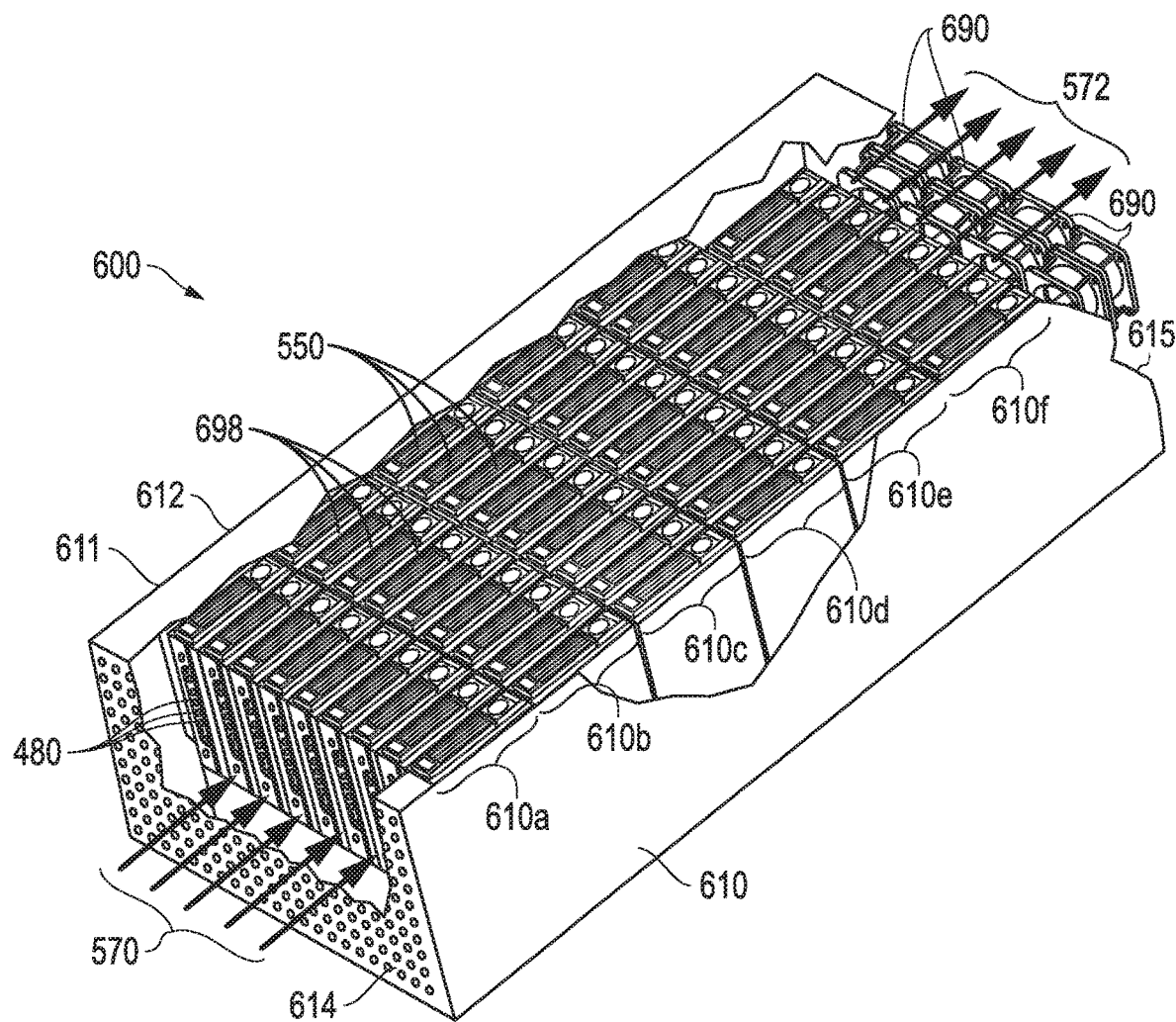
FIG. 6A illustrates a cut-away perspective view of a dense storage drive enclosure according to one exemplary embodiment of the disclosed systems and methods.
Figure 6B:
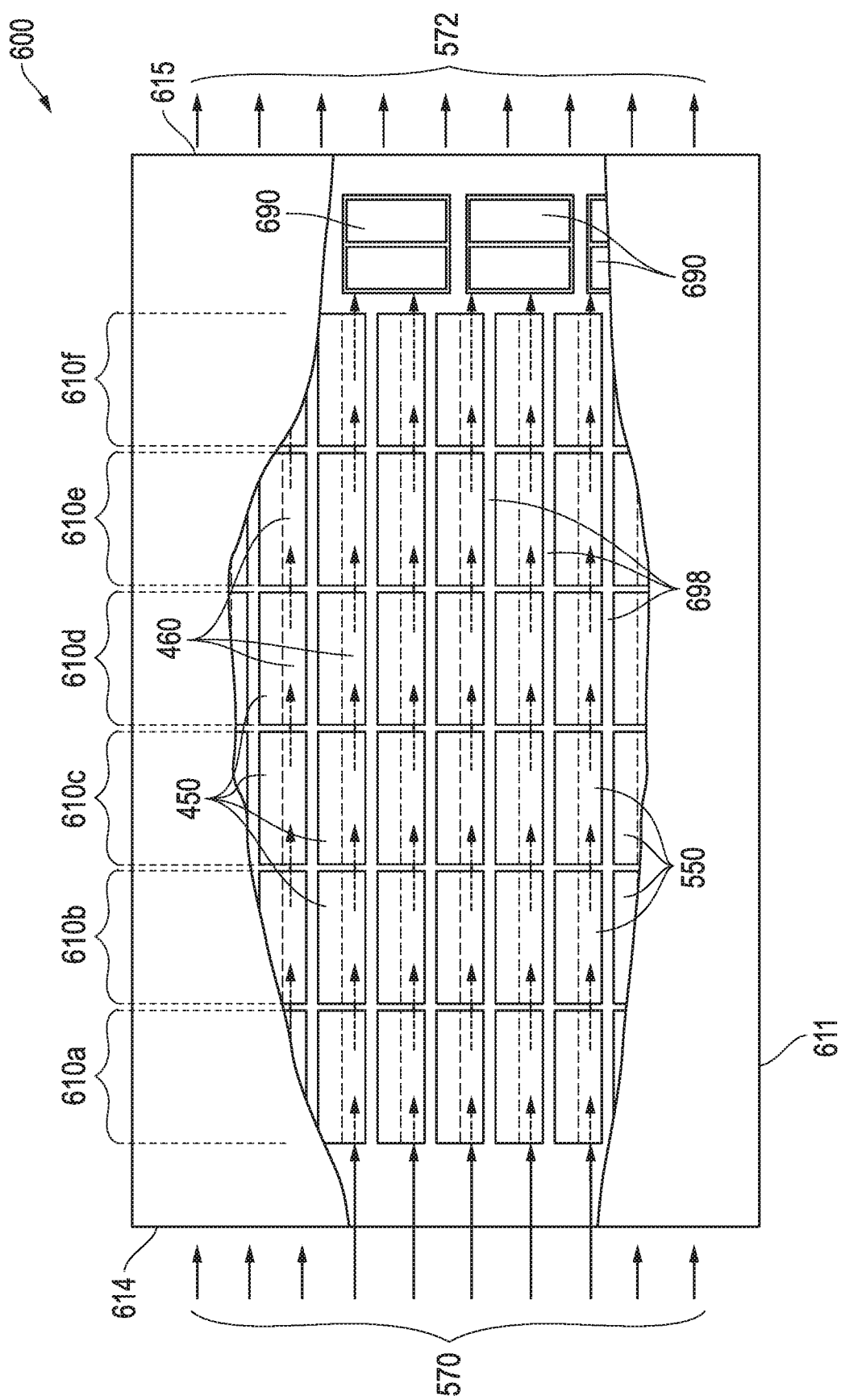
FIG. 6B illustrates a cut-away top view of a dense storage drive enclosure according to one exemplary embodiment of the disclosed systems and methods.

FIG. 6A illustrates a cut-away perspective view of one exemplary embodiment of drawer and drive components of a drawer-based dense storage drive enclosure 600 according to the disclosed systems and methods. FIG. 6B illustrates a cut-away top view of the enclosure embodiment of FIG. 6A. Storage drive enclosure 600 may be operative coupled, for example, to an information handling system as part of an enterprise storage system such as a redundant array of independent disks (RAID) storage system. Further information on RAID systems may be found, for example, in United States Patent Application Publication 2012/0110262, which is incorporated herein by reference in its entirety for all purposes. It will be understood that a RAID storage system environment is just one example embodiment, and that the disclosed systems and methods may be implemented in any other storage or other information handling system application that employs one or more hard disk drive assemblies.

As shown in FIGS. 6A and 6B, enclosure 600 includes a drawer assembly that supports multiple and parallel rows 610a to 610f of closely-spaced hard drive systems 550 (including hard drive assemblies 400 assembled to their corresponding drive carrier assemblies 500) mounted in a side-to-side orientation across the drawer of the enclosure 600, with rear-mounted cooling fans 690 that draw fresh cooling air 570 into the enclosure 600 through an air-permeable front chassis wall 614 (e.g., grill, perforated sheet, etc.) of the enclosure 600 and expel the warmed cooling air 572 from the back of the enclosure 600. In this embodiment, the multiple rows 610 of hard drive systems 550 are arranged so that one or both of the side walls of the individual hard drive systems 550 of a first one of the multiple rows 610 of hard drive systems 550 faces the side walls of respective individual hard drive systems 550 of an adjacent one of the multiple rows 610 of hard drive systems 550. As further shown, the multiple rows 610 of hard drive systems 550 are also arranged such that the cooling fans 690 are configured to induce lateral side-to-side flow of cooling air first through the flow channel of each given one of the two or more hard drive systems 550 of a first one of the multiple rows (e.g., such as row 610a) of hard drive systems 550 that is closer to the cooling air inlet 614 and then subsequently through the flow channel of each given one of the two or more hard drive systems 550 of a second and downstream (or downwind) one of the multiple rows (e.g., such as row 610b-610f) of hard drive systems that is further from the cooling air inlet 614 than the first one of the multiple rows 610.

As illustrated, enclosure 600 also includes chassis enclosure side walls 611 and chassis lid 612 that together with chassis enclosure base surface 613 surround rows 610 to form a cooling air flow seal around the rows 610 of mounted drive assemblies 400. Such a storage enclosure 600 may be configured for operatively storing multiple hard drive systems 550 in any suitable manner with one side wall 136 or 138 of each drive assembly 400 facing toward the front of the enclosure 600, e.g., top-loadable through removable lid 612, top-loadable into pull out drawer, front-loadable through removable front chassis wall 614, or loadable using any other suitable manner.

As further shown in FIGS. 6A and 6B, during operation of storage fresh cooling air 570 is drawn into enclosure 600 through air-permeable front wall 614 by virtue of suction action of rear cooling fans 572, and flows first into the side-wall air flow openings 480 and though the cavity 410 of each of the drive assemblies 400 of first row 610a. In one exemplary embodiment, drive assemblies 400 may be contained within enclosure 600 such that openings 480 of each of drive assemblies 400 of each of subsequent rows 610b to 610f may be longitudinally aligned with each other, e.g., such that openings 480 defined in side walls 436 of each of drive assemblies 400 of row 610a are substantially aligned with openings 480 defined in facing side walls 438 of each of drive assemblies 400 of row 610b so as to allow direct passage of cooling air 570 between drive assemblies 400 as cooling air 570 moves from first row 610a of drive assemblies 400 to the last row 610f of drive assemblies 400. In such an embodiment, cooing air 570 successively flows into the side-wall air flow openings 480 and though the cavity 410 in base portion 460 of each of the subsequent drive assemblies 400 of rows 610b to 610f before exiting out rear side 615 of enclosure 570 due to action of rear cooling fans 572 as shown by dashed air flow arrows in FIG. 6B. In this manner, each of drives 400 is cooled by cooling air passing through its respective cavity 410 in a manner that is not possible with conventional mounted drive assemblies 100 of FIGS. 1 and 2 in which the solid side wall profile (136 or 138) of the drive assembly 100 completely blocks the lateral (side-to-side) flow of air through the drive assemblies as shown by arrows 292 in FIG. 2.

Still referring to the exemplary embodiment of FIGS. 6A and 6B, gaps 698 between individual hard drive systems 550 of each row 610 may vary based on characteristics of a given system, and may be of sufficient width (e.g., in one exemplary embodiment about 4 millimeters, or any other suitable greater or lesser width) to conduct at least a portion of air flow 570 between individual drive assemblies 400 of hard drive systems 550, although this is not necessary since cooling air flow 570 is allowed to pass through the openings 480 and cavities 410 of the individual drive assemblies 400. In this regard, it will be understood that greater air flow through the openings 480 and cavities 410 of the individual drive assemblies 400 of a given system allows reduced size of gaps 698 to be employed to achieve particular thermal goals for that system. Thus, in one exemplary embodiment, adjacent hard drive systems 550 of a given row 610 may be mounted back-to-back within enclosure 600 with substantially no gap existing between individual hard drive systems 550, maximizing the use of space and maximizing the drive density by increasing the number of drives 400 that may be contained within a given interior volume of a storage enclosure 600 while at the same time providing sufficient cooling for the drive assemblies 400 during operation of the storage system.

It will be understood that the configuration of storage drive enclosure 600 of FIGS. 6A and 6B is exemplary only and that the disclosed hard drive systems 550 may be mounted into any other configuration of storage enclosure with any other configuration and/or location of cooling air flow source that induces lateral side-to-side of cooling air flow source across one or more of the mounted drives 400. For example, it is possible that one or more rows of hard drive systems 550 may be longitudinally-oriented with their sides 436 and 438 facing the sides of a drive enclosure assembly that is configured to provide cooling air flow from one side of the enclosure to the other side of the enclosure across the drives 400 (i.e., rather than from front to back). Moreover, in addition to drawer-type dense storage drive enclosures, the disclosed hard drive systems 550 may be mounted into hard drive system enclosures such as rack server chassis enclosures having one or more rows of hard drive assemblies. It is also possible that benefit of the disclosed systems and methods may be realized in an information handling system embodiment having as few as one of drive assemblies 400 (e.g., such as internal to a desktop or laptop information handling system) that is provided with lateral side-to-side cooling air flow through the openings 480 and cavity 410 of the given drive assembly 400.

Figure 7:
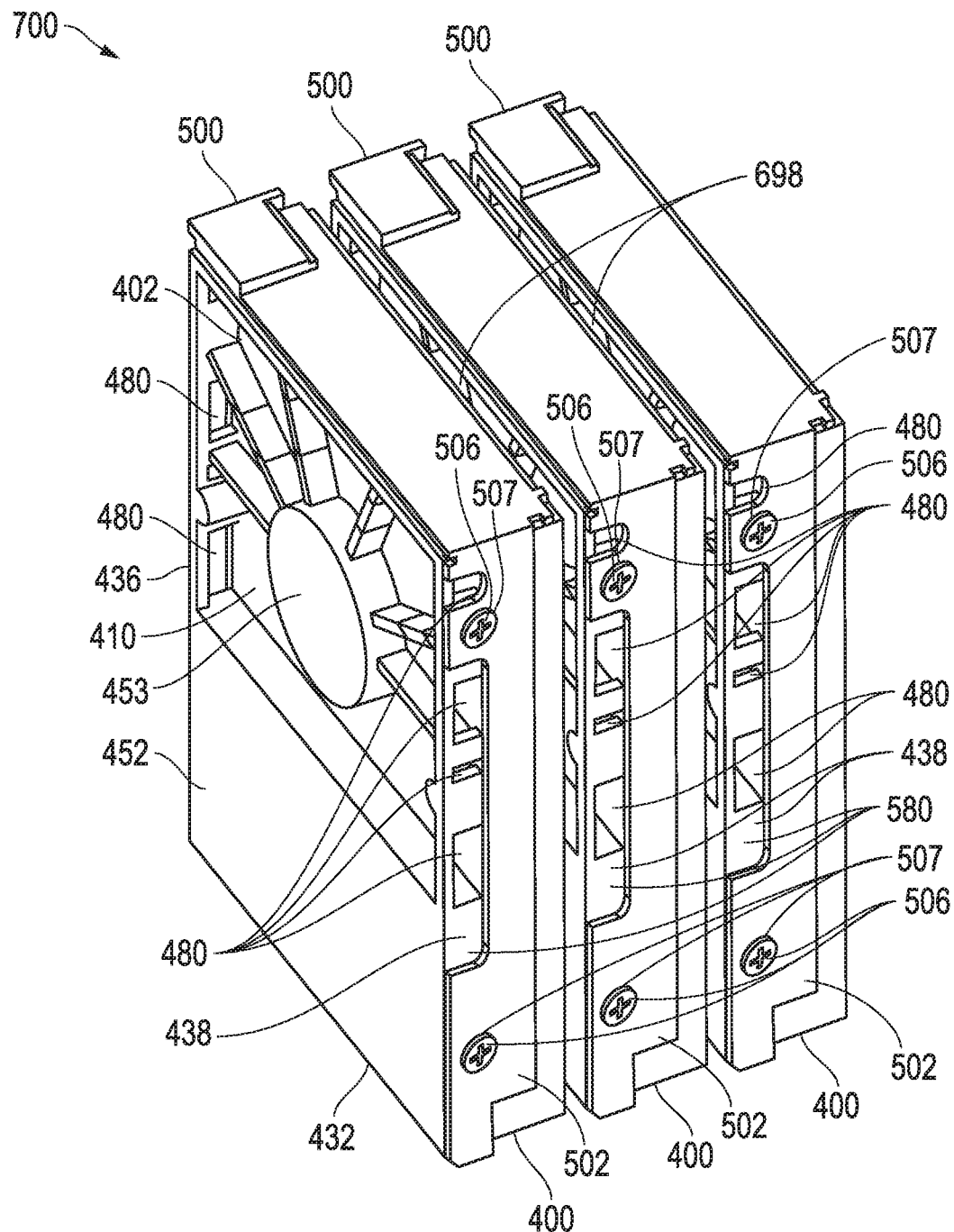
FIG. 7 illustrates a side perspective view of a row of three mountable hard drive systems according to one exemplary embodiment of the disclosed systems and methods.

It will also be understood that the illustrated drive assembly embodiment of FIGS. 4 and 5 is exemplary only, and that any other configuration of open flow areas/s may be defined in opposing side walls 436 and 438 of the base portion 460 of a drive assembly that is suitable for allowing lateral side-to-side air flow through a cavity 410 defined in the base portion 460 of a drive assembly. For example, FIG. 7 illustrates an alternate embodiment of a row of three mountable hard drive systems 550 that each include drive assemblies with openings 480 in the form of multiple longitudinally-aligned rectangular notches or slots that are defined along the length of the bottom of the side rail within each of side walls 436 and 438, and that are each in turn shown assembled to respective drive carrier assemblies 500 and mounted in a row to leave gaps 698 between the adjacent systems 550. It will be understood that the number, shape and dimensions of openings 480 may be selected to achieve and/or balance a desired air flow capacity with structural integrity of side walls 436 and 438 of drive assemblies 400. In this regard, circular (e.g., drilled) openings 480 may provide greater structural integrity, while similarly sized rectangular notches or slots may be easier to implement and may provide slightly greater air flow performance. In another exemplary embodiment, the pattern of openings 480 of FIG. 7 may be replaced by a single elongated longitudinal slot opening that spans the length of the opening pattern of FIG. 7.

It will also be understood that the particular configuration of recessed open area 580 that is illustrated defined in carrier side components 502 and 504 of a drove carrier assembly 500 of FIGS. 5, 6A and 7 is exemplary only, and that any other suitable configuration of open area/s may be employed, including any pattern (number, size and/or shape) of one or more opening/s, may be alternatively defined in side components 502 and 504 that is suitable for at least partially or completely overlapping and/or aligning with one or more flow openings 480 defined in opposing side walls 436 and 438 of a base portion 460 of a drive assembly 400 that is to be mated and assembled to the given drive carrier assembly 500 to form a mountable hard drive system 550. For example, in one alternate embodiment, separate and discrete openings may be defined in in carrier side components 502 and 504 of a given drove carrier assembly 500. And, in a further exemplary embodiment, such separate and discrete openings may be of similar shape, size and pattern as the flow openings 480 defined in opposing side walls 436 and 438 of a base portion 460 of a drive assembly 400 to which the given drove carrier assembly 500 is to be assembled. Similarly, it is also possible that a single recessed open area may be defined in each of the side walls 436 and 438 of a base portion 460 of a given drive assembly 400, e.g., to match or otherwise at least partially or completely overlap and/or align with a recessed open area defined in carrier side components 502 and 504 of a given drove carrier assembly 500 that is to be mated and assembled to the given drive assembly 400.

Figure 1:
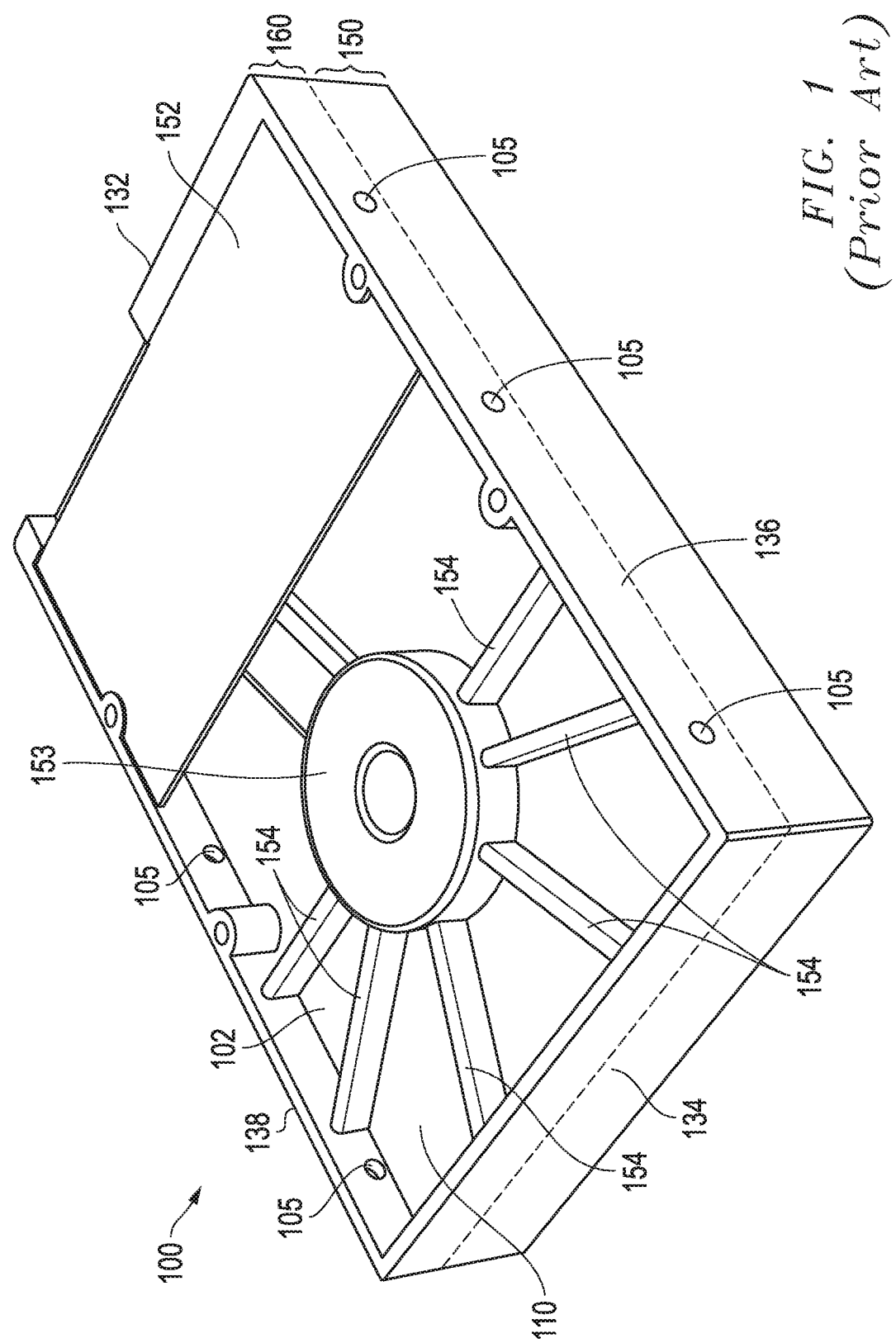
FIG. 1 illustrates a bottom perspective view of a conventional hard drive assembly.
Figure 2:
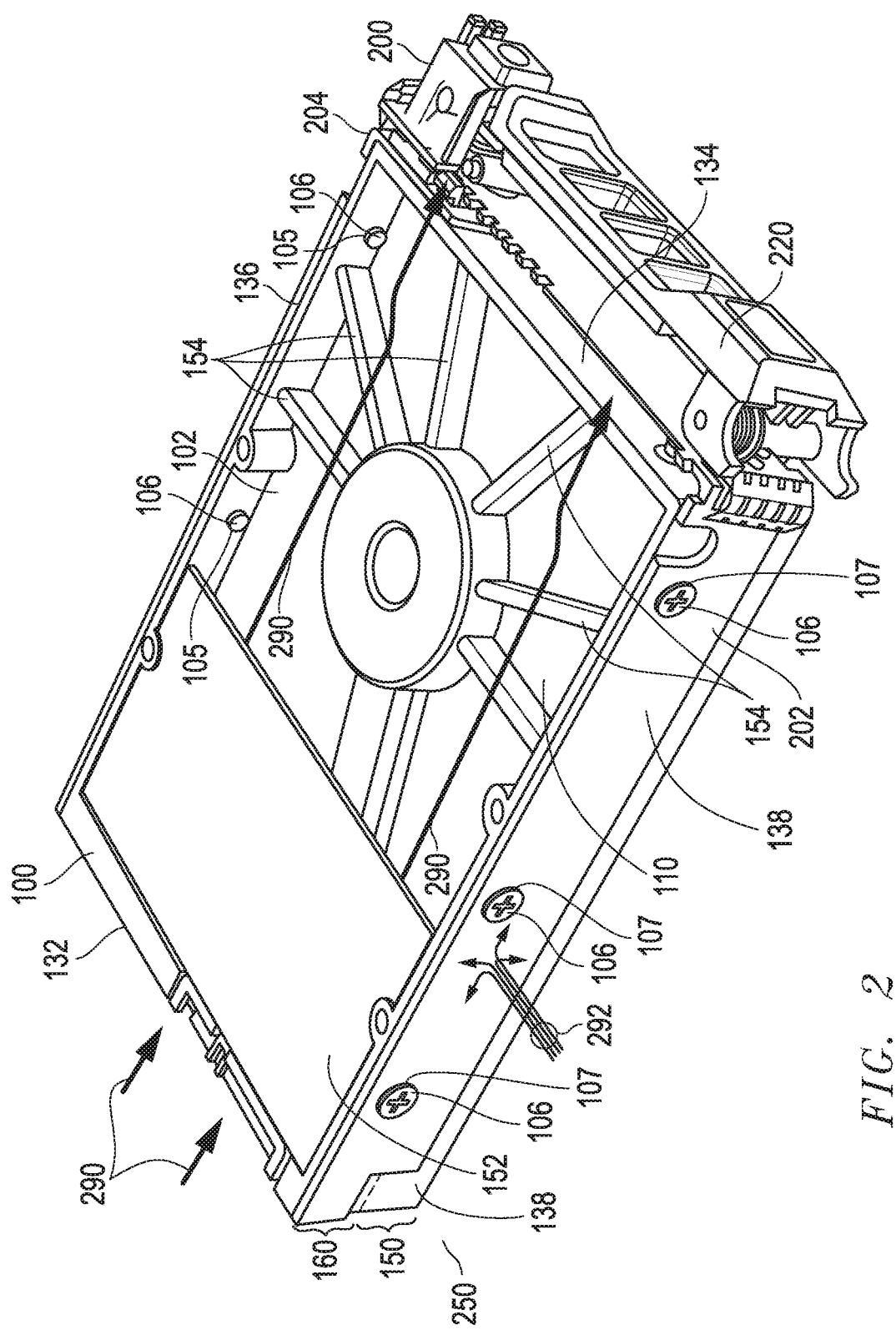
FIG. 2 illustrates a bottom perspective view of a conventional mountable hard drive system.
Figure 3:
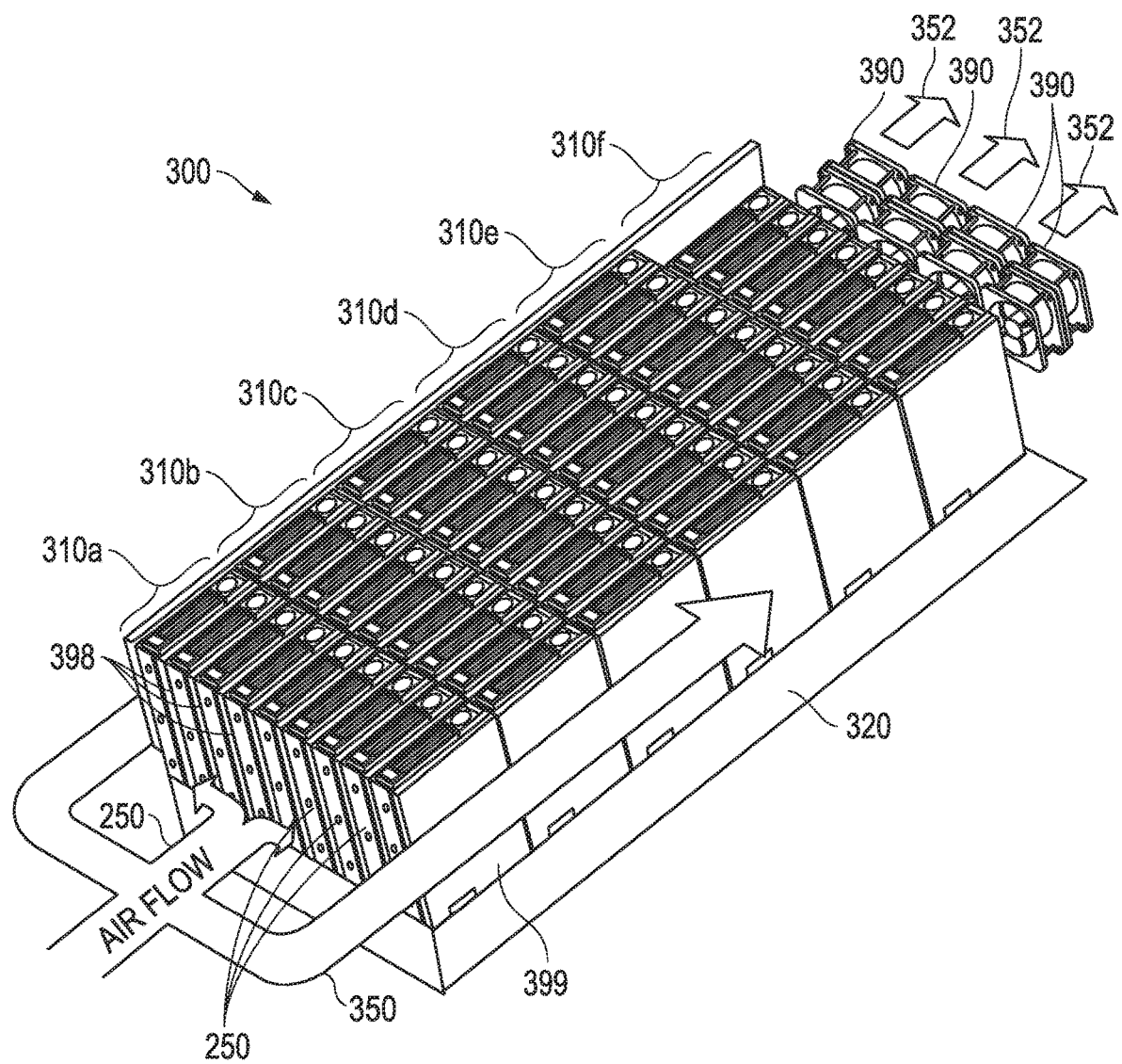
FIG. 3 illustrates a cut-away perspective view of a conventional drawer-based dense storage drive enclosure.
Figure 8:
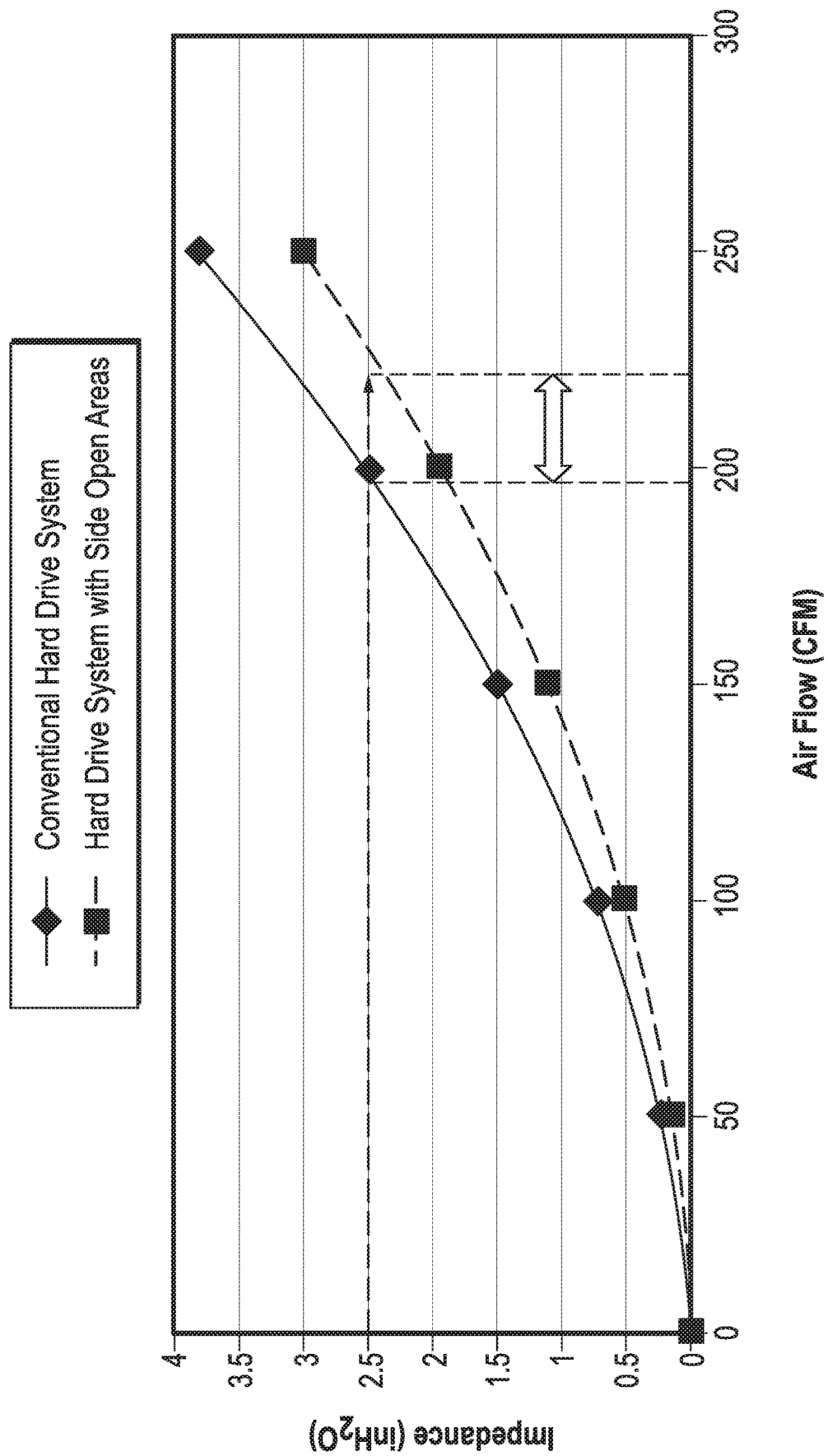
FIG. 8 illustrates a comparative graph of simulated air flow impedance versus air flow rate.

FIG. 8 illustrates a graph of computational fluid dynamics (CFD) simulated air flow impedance (in inches or water) versus air flow rate (in cubic feet per minute) as measured across the front-to-back length of an enclosed dense storage enclosure for two different types of mountable hard drive systems installed in multiple laterally oriented side-to-side rows within the dense storage enclosure with the side walls of the drive assemblies oriented to face the front or rear of the drive enclosure in a manner similar to that illustrated in FIG. 5 or 6A and 6B. For the test data, the dense storage enclosure included rear-mounted cooing fans that draw air from front-to-back across the installed drives of the enclosure in a direction perpendicular to the side walls of the installed hard drive assemblies. As shown, one set of impedance data is measured for a set of conventional hard drive systems (including conventional hard drive assemblies and mated conventional drive carrier assemblies such as illustrated in FIGS. 1 and 2) that are installed in multiple side-to-side rows within the dense storage enclosure in a manner similar to that illustrated in FIG. 5. The other set of impedance data is measured for a set of hard drive systems that include hard drive assemblies and mated drive carrier assemblies each configured with aligned side open areas according to the disclosed systems and methods, such as illustrated in FIGS. 4 and 5 and that are shown installed in multiple rows within the dense storage enclosure in a manner similar to that illustrated in FIGS. 6A and 6B.

The test data of FIG. 8 shows that for the same given flow impedance, a greater cooling air flow rate through the dense storage enclosure and across the installed hard drive systems is achieved using the disclosed hard drive systems with aligned side open areas than is achieved with the conventional hard drive systems. For example, at the same given air flow impedance of 2.5 inches of water, greater than a 10% increase in air flow is achieved using the hard drive systems configured with aligned side open areas (i.e., about 220 CFM compared to about 197 CFM). Additionally, lower air flow impedance may be achieved for the same given cooling air flow rate using the hard drive systems configured with aligned side open areas (i.e., about 2.5 inches of water compared to about 3 inches of water at a flow rate of about 220 CFM).

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A mountable hard drive system, comprising:
    a hard drive comprising:
        a front end, a back end, and two opposing side walls extending between the front end and back end of the hard drive,
        a bottom surface having a drive cavity defined therein between the two opposing side walls, and
        at least one open area defined in each of the opposing side walls, the open area of each side wall being in fluid communication with the drive cavity; and
    a drive carrier assembly, comprising two opposing side rail components, each of the side rail components having at least one air flow area defined therein;
    where each given one of the two side rail components of the drive carrier assembly is mechanically coupled to a different one of the two opposing side walls of the hard drive such that the open flow area of the given side rail component is at least partially aligned with the open flow area of the given one of the opposing side walls of the hard drive to form an air flow channel across the drive cavity of the hard drive between the two opposing side walls and the two opposing side rail components.

2. The hard drive system of claim 1, where the open area defined in each of the given hard drive side walls comprises multiple air flow openings defined in the given side wall; and where the open air flow defined in each given one of the side rail components of the drive carrier assembly comprises a recessed open area.

3. The hard drive system of claim 2, where the recessed open area defined in each given one of the side rail components of the drive carrier assembly completely overlaps the multiple air flow openings defined in a given one of the side rail components of the drive carrier assembly to which the given one of the of the side rail components of the drive carrier assembly is mechanically coupled.

4. The hard drive system of claim 1, where the drive carrier assembly further comprises a cross member coupled between the two opposing side rail components; and where each given one of the side rail components of the drive carrier assembly is mechanically coupled to a given one of the side walls of the hard drive such that the cross member is disposed adjacent the rear end of the hard drive.

5. The hard drive system of claim 1, where the hard drive further comprises a printed circuit board (PCB) assembly disposed on the bottom surface of the hard drive adjacent the front end of the hard drive; and where the drive cavity is defined in the bottom surface of the hard drive between the PCB assembly and the back end of the hard drive.

6. The hard drive system of claim 1, where the hard drive further comprises:
    a top portion that includes a hermetically sealed space that contains the drive media and read/write arm (heads); and
    a base portion that includes the bottom surface and drive cavity defined therein.

7. The hard drive system of claim 1, where the open area defined in each of the given hard drive side walls comprises multiple circular-shaped air flow holes.

8. The hard drive system of claim 1, where the open area defined in each of the given hard drive side walls comprises multiple square-shaped or rectangular-shaped air flow slots.

9. A hard drive enclosure system, comprising:
    at least one hard drive system mounted within a separate hard drive enclosure, the mountable hard drive system comprising a hard drive and a drive carrier assembly mechanically coupled to the hard drive;
    where the hard drive is separate and different from the drive carrier assembly and where the hard drive comprises:
        a front end, a back end, and two opposing side walls extending between the front end and back end of the hard drive,
        a bottom surface having a drive cavity defined therein between the two opposing side walls,
        a top surface opposite the bottom surface, and
        at least one open area defined in each of the opposing side walls, the open area of each side wall being in fluid communication with the drive cavity;
    where the drive carrier assembly comprises two opposing side rail components with the separate hard drive disposed between the two side rail components, each given one of the side rail components having at least one air flow area defined therein and being mechanically coupled to a different one of the two opposing side walls of the hard drive such that the open flow area of the given side rail component is at least partially aligned with the open flow area of the given one of the opposing side walls of the hard drive to form an air flow channel across the drive cavity of the hard drive between the two opposing side walls and the two opposing side rail components;
    where the hard drive enclosure system further comprises:
        multiple enclosure walls surrounding the separate hard drive system, and
        a cooling air flow source configured to induce lateral side-to-side flow of cooling air through the flow channel of the hard drive system across the drive cavity of the hard drive between the two opposing side walls of the hard drive and the two opposing side rail components of the drive carrier assembly that is separate and different from the hard drive.

10. The hard drive enclosure system of claim 9, where at least one hard drive system comprises at least one row of two or more of the hard drive systems mounted in top-to-bottom aligned relationship with each other therein such that the cooling air flow source is configured to induce lateral side-to-side flow of cooling air through the flow channel of each of the two or more hard drive systems across the drive cavity of the hard drive of each given one of the two or more hard drive systems between the two opposing side walls and the two opposing side rail components of each given one of the two or more hard drive systems.

11. The hard drive enclosure system of claim 9, where at least one hard drive system comprises multiple rows of two or more of the hard drive systems mounted in top-to-bottom aligned relationship with each other therein such that the cooling air flow source is configured to induce lateral side-to-side flow of cooling air through the flow channel of each given one of the two or more hard drive systems of each of the multiple rows across the drive cavity of the hard drive of each given one of the two or more hard drive systems of each of the multiple rows of hard drive systems.

12. The hard drive enclosure system of claim 11, where the multiple rows of two or more hard drive systems are arranged so that the side walls of the individual hard drive systems of a first one of the multiple rows of hard drive systems faces the side walls of the individual hard drive systems of an adjacent second one of the multiple rows of hard drive systems, and such that the cooling air flow source is configured to induce lateral side-to-side flow of cooling air first through the flow channel of each given one of the two or more hard drive systems of the first one of the multiple rows of hard drive systems and then subsequently through the flow channel of each given one of the two or more hard drive systems of the second one of the multiple rows of hard drive systems.

13. The hard drive enclosure system of claim 11, where the multiple rows of two or more hard drive systems are mounted within the enclosure such that the open areas of the hard drive systems of a first one of the multiple rows of hard drive systems are longitudinally aligned with the open areas of the hard drive systems of a second and adjacent one of the multiple rows of hard drive systems so as to allow substantially direct passage of cooling air from an open area of each of the of the hard drive systems of the first one of the multiple rows of hard drive systems to an open area of a respective one of the of the hard drive systems of the second and adjacent one of the multiple rows of hard drive systems.

14. The hard drive enclosure system of claim 11, where the adjacent hard drive systems of each of the multiple rows of two or more hard drive systems are mounted in top-to-bottom aligned relationship with each other within the enclosure with substantially no gap therebetween.

15. The hard drive enclosure system of claim 11, further comprising:
first and second opposing ends with the multiple rows of two or more of hard drive systems disposed therebetween;
an air inlet being disposed adjacent the first end of the enclosure; and
an air outlet being disposed adjacent the second end of the enclosure;
where the cooling air flow source comprises one or more cooling fans disposed adjacent the second end of the enclosure and configured to induce a flow of the cooling air from the air inlet of the enclosure through the flow channel and drive cavity of each given one of the two or more hard drive systems of each of the multiple rows of hard drive systems to the air outlet of the enclosure.

16. The hard drive enclosure system of claim 11, where the hard drive enclosure comprises a dense storage drive enclosure.

17. The hard drive enclosure system of claim 11, where the hard drive enclosure comprises a rack server chassis enclosure.

18. A method of cooling at least one mountable hard drive system, the method comprising providing cooling air to a mountable hard drive system that itself comprises:
a hard drive comprising:
a front end, a back end, and two opposing side walls extending between the front end and back end of the hard drive,
a bottom surface having a drive cavity defined therein between the two opposing side walls, and
at least one open area defined in each of the opposing side walls, the open area of each side wall being in fluid communication with the drive cavity; and
a drive carrier assembly that is separate and different from the hard drive, the drive carrier assembly comprising two opposing side rail components with the separate hard drive disposed between the two side rail components, each of the side rail components having at least one air flow area defined therein;
where each given one of the two side rail components of the drive carrier assembly is mechanically coupled to a different one of the two opposing side walls of the hard drive such that the open flow area of the given side rail component is at least partially aligned with the open flow area of the given one of the opposing side walls of the hard drive to form an air flow channel across the drive cavity of the hard drive between the two opposing side walls and the two opposing side rail components; and
where the method further comprises using a cooling air flow source to induce lateral side-to-side flow of cooling air through the flow channel of the hard drive system across the drive cavity of the hard drive between the two opposing side walls of the hard drive and the two opposing side rail components of the drive carrier assembly that is separate and different from the hard drive.

19. The method of claim 18, where at least one hard drive system comprises multiple rows of two or more of the hard drive systems mounted in top-to-bottom aligned relationship with each other within a hard drive enclosure system; and where the method further comprises using the cooling air flow source to induce lateral side-to-side flow of cooling air through the flow channel of each given one of the two or more hard drive systems of each of the multiple rows across the drive cavity of the hard drive of each given one of the hard drive systems.

20. A drive carrier assembly configured for mechanically coupling to a hard drive to form a mountable hard drive system, the drive carrier system comprising:
two opposing side rail components, each of the side rail components having at least one air flow area defined therein;
where each given one of the two side rail components of the drive carrier assembly is configured to be mechanically coupled to a different one of two opposing side walls of a hard drive that itself has:

a front end, a back end, and two opposing side walls extending between the front end and back end of the hard drive, a bottom surface having a drive cavity defined therein between the two opposing side walls, and at least one open area defined in each of the opposing side walls, the open area of each side wall being in fluid communication with the drive cavity; and where each given one of the two side rail components of the drive carrier assembly is configured to be mechanically coupled to a different one of the two opposing side walls of the hard drive such that the open flow area of the given side rail component is at least partially aligned with the open flow area of the given one of the opposing side walls of the hard drive to form an air flow channel across the drive cavity of the hard drive between the two opposing side walls and the two opposing side rail components.

21. The drive carrier assembly of claim 20, where the hard drive is a 3.5 inch hard disk drive (HDD) having a lateral dimensional width of about 3.5 inches; and where the drive carrier assembly is configured for mechanically coupling to the 3.5 inch hard disk drive (HDD) to form the mountable hard drive system.

22. The hard drive system of claim 1, where the hard drive is a 3.5 inch hard disk drive (HDD) having a lateral dimensional width of about 3.5 inches.

23. The hard drive system of claim 1, where the hard drive is a metal casting that forms the front end, the back end, the two opposing side walls, and the bottom surface of the hard drive; where the at least one open area is defined in each of the opposing side walls of the metal casting of the hard drive; and where the drive carrier assembly is separate and different from the metal casting of the hard drive.

24. The hard drive system of claim 23, where the hard drive further comprises a printed circuit board (PCB) assembly disposed on the bottom surface of the metal casting of the hard drive adjacent the front end of the hard drive; where the drive cavity is defined in the bottom surface of the metal casting of the hard drive between the PCB assembly and the back end of the hard drive; and where the hard drive further comprises:

a top portion of the metal casting that includes a hermetically sealed space defined within the metal casting that contains the drive media and read/write arm (heads), and a base portion of the metal casting that includes the bottom surface and drive cavity defined therein.

25. The hard drive system of claim 23, where the metal casting has a lateral dimension of 3.5 inches between the opposing side walls, and a longitudinal (major axis) dimension of 6 inches between the front end and the back end.

* * * * *